United States Patent
Vimercati et al.

(10) Patent No.: US 10,163,482 B2
(45) Date of Patent: Dec. 25, 2018

(54) GROUND REFERENCE SCHEME FOR A MEMORY CELL

(71) Applicant: Micron Technology, Inc., Boise, ID (US)

(72) Inventors: Daniele Vimercati, El Dorado Hills, CA (US); Scott James Derner, Boise, ID (US); Umberto Di Vincenzo, Capriate San Gervasio (IT); Christopher John Kawamura, Boise, ID (US); Eric S. Carman, San Francisco, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/855,326

(22) Filed: Dec. 27, 2017

(65) Prior Publication Data

US 2018/0190337 A1    Jul. 5, 2018

Related U.S. Application Data

(62) Division of application No. 15/057,914, filed on Mar. 1, 2016, now Pat. No. 9,934,837.

(51) Int. Cl.
   *G11C 11/22*    (2006.01)

(52) U.S. Cl.
   CPC ........ *G11C 11/2273* (2013.01); *G11C 11/221* (2013.01); *G11C 11/2293* (2013.01)

(58) Field of Classification Search
   CPC .............................................. G11C 11/2273
   See application file for complete search history.

(56) References Cited

U.S. PATENT DOCUMENTS

| | | | |
|---|---|---|---|
| 6,058,049 A | 5/2000 | Kye et al. | |
| 6,847,539 B2 | 1/2005 | Aoki | |
| 7,177,174 B2 | 2/2007 | Jeon | |
| 7,262,985 B2 | 8/2007 | Sakai | |
| 8,570,812 B2 | 10/2013 | Madan | |

(Continued)

OTHER PUBLICATIONS

ISA/EPO, International Search Report and Written Opinion of the International Searching Authority, Int'l. Appl. No. PCT/US2017/020251, dated Jun. 15, 2017, Korean Intellectual Property Office, Seo-gu, Daejeon, Republic of Korea, 15 pgs.

(Continued)

*Primary Examiner* — Hoai V Ho
*Assistant Examiner* — Jay Radke
(74) *Attorney, Agent, or Firm* — Holland & Hart LLP

(57) ABSTRACT

Methods, systems, and devices for operating a ferroelectric memory cell or cells are described. A ground reference scheme may be employed in a digit line voltage sensing operation. A positive voltage may be applied to a memory cell; and after a voltage of the digit line of the cell has reached a threshold, a negative voltage may be applied to cause the digit line voltages to center around ground before a read operation. In another example, a first voltage may be applied to a memory cell and then a second voltage that is equal to an inverse of the first voltage may be applied to a reference capacitor that is in electronic communication with a digit line of the memory cell to cause the digit line voltages to center around ground before a read operation.

20 Claims, 9 Drawing Sheets

(56) References Cited

U.S. PATENT DOCUMENTS

2005/0094457 A1    5/2005  Chen et al.
2005/0146913 A1*   7/2005  Madan ................... G11C 11/22
                                                        365/145

OTHER PUBLICATIONS

Kawashima et al., "Bitline GND Sensing Technique for Low-Voltage Operation FeRAM," IEEE Journal of Solid-State Circuits, May 2002, pp. 592-598, vol. 37, No. 5, IEEE.

* cited by examiner

800

GROUND REFERENCE SCHEME FOR A MEMORY CELL

CROSS REFERENCE

The present application for patent is a divisional of U.S. patent application Ser. No. 15/057,914 by Vimercati et al., entitled "Ground Reference Scheme For A Memory Cell," filed Mar. 1, 2016, now U.S. Pat. No. 9,934,837, issued Apr. 3, 2018, assigned to the assignee hereof, and is expressly incorporated by reference in its entirety herein.

BACKGROUND

The following relates generally to memory devices and more specifically to a ground reference scheme for a ferroelectric memory cell.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may be an example of a volatile memory device and may store a logic state by charging or discharging a capacitor. A charged capacitor, however, may become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. FeRAM sensing schemes may rely on a non-zero reference voltage to compare with a digit line voltage in order to determine a state stored in a memory cell. Using a non-zero reference voltage may, however, fail to accommodate variations in the digit line voltage and may further introduce errors in the read operation.

BRIEF DESCRIPTION OF THE DRAWINGS

The disclosure herein refers to and includes the following figures.

DETAILED DESCRIPTION

Figure 1:
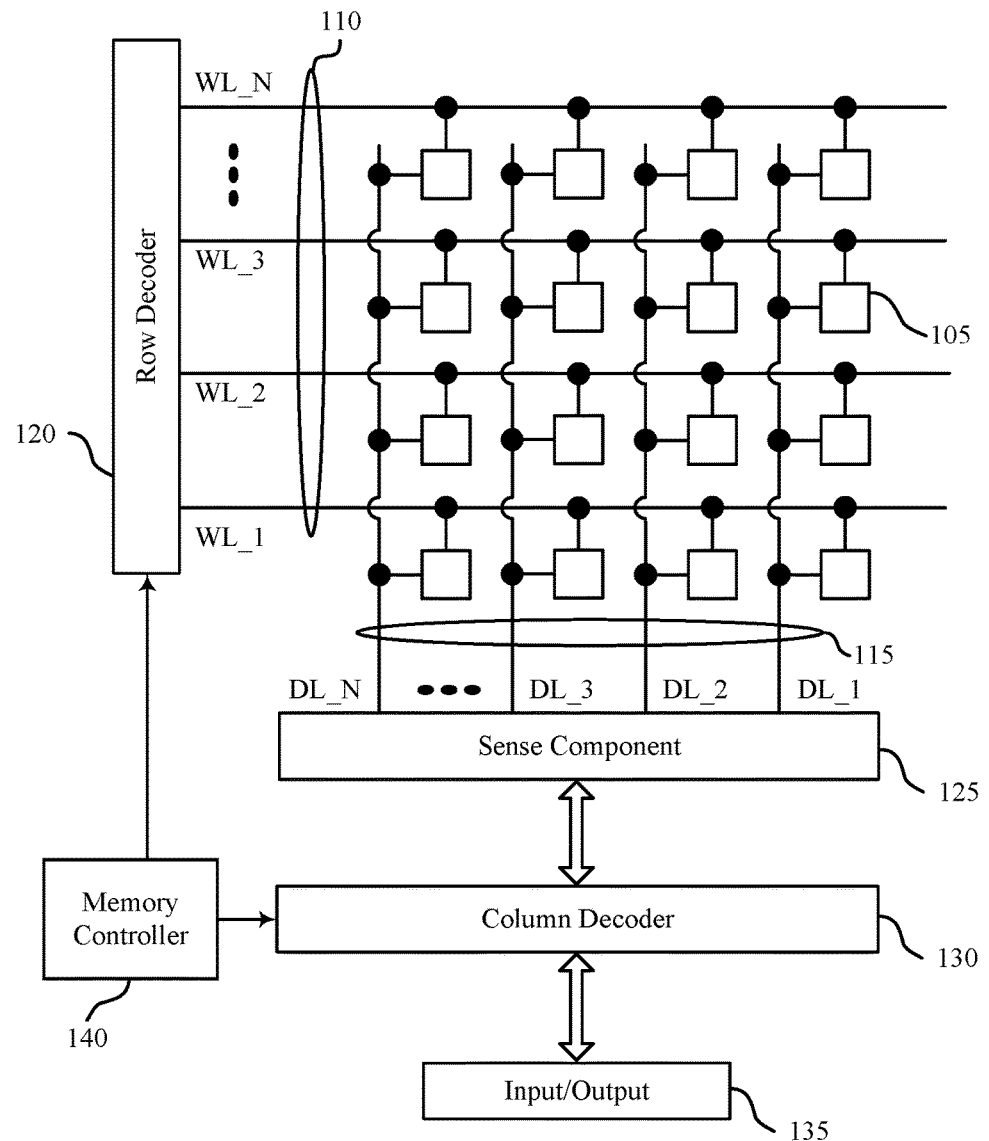
FIG. 1 illustrates an example memory array that supports a ground reference scheme for a memory cell in accordance with various embodiments of the present disclosure.

A memory device may use a ground reference scheme to increase the reliability of a digit line voltage sensing operation. Ground reference schemes describe herein may employ techniques that cause possible read voltages of a digit line—i.e., voltages representing a logic "1" and a logic "0" of a memory cell—to be centered about ground. Digit line voltages sensed during a read operation may thus be input to a sense amplifier and compared against a ground reference. In the absence of the ground reference scheme, the voltage of the digit line during a read operation may need to be compared to some non-zero value, which may be different from different cells or arrays, or both. Comparison to a non-zero value may thus result in a read operation that is more sensitive to digit line variations and therefore more error prone.

By way of example, a positive voltage may be applied to a plate of a ferroelectric capacitor of a memory cell, and the cell may be selected to discharge the ferroelectric capacitor to a digit line. Once a certain time has elapsed, or once the digit line voltage has reached a certain threshold, a negative voltage may be applied to the plate of the ferroelectric capacitor. The application of the negative voltage may cause the digit line voltage to drop so that the two possible values of the digit line representative of the logic states of the memory cell (i.e., a logic "1" or "0") are centered about zero volts. The voltage of the digit line may then be read and compared with a reference voltage equal to zero volts. For example, a positive digit line voltage may represent a logic "1," while a negative digit line voltage may represent a logic "0."

The benefits of a ground reference scheme may also be realized without a need for a negative voltage source. For example, a reference circuit, including a reference capacitor, may be used with a memory cell. The memory cell may be selected and a voltage applied to the plate of a capacitor of the memory cell at the same time (or nearly the same time) an inverse of the voltage may be applied to the reference capacitor. The charge stored in the cell may be transferred to the digit line while the reference capacitor may draw stored charge off the digit line. So, as described below, the reference capacitor may remove a charge from the digit line and cause the two possible values of the digit line the represent the logic states of the memory cell (i.e., a logic "1" or "0") to be centered about zero volts. The benefits of the ground reference scheme discussed above may thus be realized.

Features of the disclosure introduced above are further described below in the context of a memory array. Specific examples are then described with reference to circuits that may be used for a ground reference scheme. These and other features of the disclosure are further illustrated by and described with reference to apparatus diagrams, system diagrams, and flowcharts that relate to a ground reference scheme or schemes for a memory cell.

FIG. 1 illustrates an example memory array 100 that supports a ground reference scheme for a memory cell in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 or digit line 115, which may also be referred to as access lines. Activating or selecting a word line 110 or a digit line 115 may include applying a voltage to the respective line. In some cases, a digit line 115 may be referred to as a bit line. Word lines 110 and digit lines 115 are made of conductive materials. For example, word lines 110 and digit lines 115 may be made of metals, such as copper, aluminum, gold, tungsten, or the like. According to the example of FIG. 1, each row of memory cells 105 are connected to a single word line 110, and each column of memory cells 105 are connected to a single digit line 115. By activating (i.e., applying a voltage to) one of the word lines 110 and one of the digit lines 115, a single memory cell 105 may be accessed at their intersection. The intersection of a word line 110 and digit line 115 may be referred to as an address of a memory cell.

In some architectures, the logic-storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. Thus, by activating a word line 110 and a digit line 115, memory cell 105 may be accessed. For example, the memory array 100 may access memory cell 105 by activating DL_1 and WL_3.

Upon accessing, memory cell 105 may be read, or sensed, by sense component 125 to determine the stored state of memory cell 105. For example, after accessing the memory cell 105, the ferroelectric capacitor of memory cell 105 may discharge onto the corresponding digit line 115, inducing a voltage on the digit line 115. The voltage of the digit line 115 may be input to the sense component 125, where the voltage of the digit line 115 may be compared with a reference voltage. With respect to a memory cell 105 that includes a ferroelectric capacitor, reading the memory cell may include biasing—e.g., applying a voltage to—a plate of the ferroelectric capacitor.

Sense component 125 may include various transistors or amplifiers to detect and amplify a difference in the signals, which may be referred to as latching. Sense component 125 may include a sense amplifier that receives and compares a voltage of a digit line 115 and a reference voltage. The output of the sense amplifier may be driven to a higher (e.g., a positive) or lower (e.g., negative or ground) supply voltage based at least in part on the comparison. For instance, if digit line 115 has a higher voltage than the reference voltage, then the sense amplifier output may be driven to a positive supply voltage. In some cases, the sense amplifier may additionally drive the output of the digit line 115 to the supply voltage. Sense component 125 may then latch the output of the sense amplifier and/or the voltage of digit line 115, which may be used to determine that the stored state in memory cell 105 was a logic "1." Alternatively, if digit line 115 has a lower voltage than the reference voltage, the sense amplifier output may be driven to a negative or ground voltage. Sense component 125 may then latch the output of the sense amplifier, which may be used to determine that the stored state in memory cell 105 was a logic "0." The detected logic state of memory cell 105 may then be output through column decoder 130 as output 135.

The memory array 100 may use any, or nearly any, voltage as a reference voltage, and sense component 125 may compare a voltage of a digit line 115 to the reference voltage to determine a logic state of memory cell 105. But the magnitude of the voltage on the digit line 115 caused by selecting memory cell 105 may vary based on a variety of factors, including the stored state (i.e., logic "1" or logic "0"), characteristics of the ferroelectric capacitor, an applied read voltage, and the like. Because of these variations, a sensed voltage may be relatively close in magnitude to the reference voltage, which may decrease the sensing margin (i.e., the "margin" between a digit line voltage that represents a logic "1" or "0" and a reference voltage). This may cause read circuitry to be more sensitive, and thus more complex, in order to accurately read the state of memory cell 105; or a narrow sensing margin may increase read errors. Furthermore, there may be an error in the voltage reference itself. For instance, variations in a supply voltage, temperature, characteristics of a digit line 115 used as a reference line (e.g., length, trace width, etc.), characteristics of the memory cell 105 (e.g., parasitic elements), etc., may affect (e.g., increase or decrease) the magnitude of a voltage on a reference line. If the reference voltage is created by using other memory cells 105, characteristics of a ferroelectric capacitor of the memory cells 105 may further affect the resulting voltage that is generated on the reference line.

Additional problems associated with using a non-zero reference may include charging of the reference digit line 115 itself—e.g., parasitic circuit elements may affect the resulting reference voltage—and errors in the read voltage applied to a plate of a memory cell 105—e.g., a higher plate voltage may be associated with increased voltages resulting from the different logic states. That is, in some cases a higher plate voltage may be applied to a memory cell 105 to increase the amount of charge that is extracted from a ferroelectric capacitor and to increase a sensing window—e.g., the difference between the voltages resulting from a logic "1" and a logic "0." Applying a higher plate voltage may, however, also increase the resulting voltages for both logic states relative to a reference voltage. Therefore, the resulting voltages may not be centered around a generated reference voltage, and the sensing margin may be decreased.

Using zero volts (0V) as a reference—e.g., a sensing scheme where the reference voltage is at ground or virtual ground—may simplify the sensing operation. As described herein, a sensing scheme that uses 0V as a reference is referred to as a ground reference scheme. A ground reference may produce more accurate results, as compared to using a non-zero voltage reference, with a similar sensing window—e.g., the voltage difference between the voltage resulting from a logic state "0" and a logic state "1"—and/or sensing margin. For example, in a ground reference scheme, a positive digit line voltage may correspond to one logic state and a negative digit voltage may correspond to a different logic state; and whether a digit line voltage is positive or negative may be easier to ascertain than whether a digit line voltage is above or below some non-zero voltage. A ground reference scheme may also reduce errors associated with generating a non-zero reference voltage and may not use additional circuitry for reference voltage generation. Furthermore, using a ground reference may reduce testing associated with initially selecting a preferred reference voltage, which may vary from memory array to memory array.

In order to employ a ground reference scheme, the possible read voltages of the digit line 115 resulting from the different logic states may be adjusted so that the voltages associated with a logic "1" and a logic "0" are centered around ground. Circuits and accompanying methods that may be implemented to adjust the voltage of the digit line 115 are described in further detail below. As described with reference to FIGS. 4 and 5, in some examples, a negative voltage may be applied to the plate of a ferroelectric cell to adjust the voltage of the digit line 115. In other examples, including those described with reference to FIGS. 6 and 7, a reference circuit may be used to adjust the voltage of the digit line 115; for instance, inverse, or complementary, voltages may be applied to the plate of a ferroelectric cell and a plate of the reference capacitor.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, the memory controller 140 may be used to implement features of the ground reference scheme. For instance, the memory controller 140 may provide an input to an amplification device that is used to apply a read voltage to the plate of a ferroelectric capacitor in a memory cell 105. In some examples, the memory controller 140 may provide a negative voltage to the amplification device, which in turn, may apply the negative voltage to the plate of the ferroelectric capacitor. In other examples, the memory controller 140 may provide selection voltages to one or more amplification devices to select a memory cell and a reference capacitor, and subsequently may apply complementary voltage to the plate of the associated ferroelectric cell and the plate of the reference capacitor.

Figure 2:
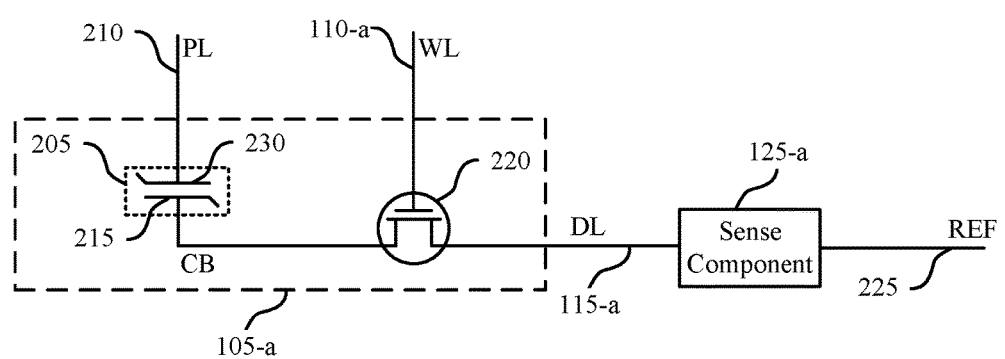
FIG. 2 illustrates an example circuit of a memory cell that supports a ground reference scheme in accordance with various embodiments of the present disclosure.

FIG. 2 illustrates an example circuit 200 of a memory cell that supports a ground reference scheme in accordance with various embodiments of the present disclosure. Circuit 200 includes a ferroelectric memory cell 105-a, word line 110-a (which may also be referred to as access line 110-a), digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205, which has a first plate and a second plate that are capacitively coupled, the first plate may be referred to as cell plate 230 and the second plate may be referred to as cell bottom 215. In some examples, the orientation of the capacitor may be flipped without changing the operation of memory cell 105-a, that is, the first plate may correspond to cell bottom 215 and the second plate may correspond to cell plate 230. In the example of FIG. 2, cell plate 230 may be accessed via plate line 210 and cell bottom 215 may be accessed via digit line 115-a. Also in the example of FIG. 2, the terminals of capacitor 205 are separated by an insulating ferroelectric material. As described above, various states may be stored by charging or discharging capacitor 205, i.e., polarizing the ferroelectric material of capacitor 205. The total charge needed to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 can be read or sensed by operating various elements represented in circuit 200. Capacitor 205 may be in electronic communication with digit line 115-a. For example, capacitor 205 can be isolated from the digit line 115-a when selection component 220 is deactivated and connected to digit line 115-a when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment the positions of selection component 220 and capacitor 205 may be switched, such that selection component 220 is between plate line 210 and cell plate 230 and such that capacitor 205 is between digit line 115-a and the other terminal of selection component 220. In this embodiment, selection component 220 may remain in electronic communication digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the state that is stored by ferroelectric capacitor 205 during a read, plate line 210 and word line 110-a may be biased by an external voltage. In some cases, digit line 115-a is isolated from a virtually ground prior to applying the external voltage to plate line 210 and word line 110-a. Selecting ferroelectric memory cell 105-a may result in a voltage difference (e.g., plate line 210 voltage minus digit line 115-a voltage) across capacitor 205. The applied voltage difference may yield a change in the stored charge on capacitor 205, which may depend on the initial state of capacitor 205—e.g., whether the initial state stored a logic "1" or a logic "0"—and may induce a voltage on digit line 115-a based on the resulting charge stored on capacitor 205. The induced voltage on digit line 115-a may then be compared to a reference (e.g., a voltage of reference line 225) by sense component 125-a in order to determine the stored logic state in memory cell 105-a.

The specific sensing scheme or process may take many forms. In one example, digit line 115-a may have an intrinsic capacitance and develop a non-zero voltage as capacitor 205 charges or discharges in response to the voltage applied to plate line 210. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of pico farads (pF)). The subsequent voltage of digit line 115-a may depend on the initial logic state of capacitor 205, and sense component 125-a may compare this voltage to a voltage on reference line 225 provided by a reference component. Circuit 200 may be operated so that the possible digit line 115 voltages during a read operation are centered about 0V. That is, a negative voltage may be applied to plate line 210 or a reference circuit (not shown) may be employed to effectively lower voltage of digit line 115 so that it can be compared with ground during a read operation.

In some examples, the reference line 225 is an unused digit line, which may be grounded. For example, a voltage may be applied to plate line 210 and a voltage at capacitor bottom 215 may change in relation to the stored charge. The voltage at capacitor bottom 215 may be compared with a reference voltage at sense component 125-a, and a comparison to the reference voltage may indicate a change in the charge of capacitor 205 resulting from the applied voltage and thus indicate a logic state stored in memory cell 105-a. The reference voltage may be 0V (i.e., ground or virtual ground). The relationship between charge and voltage in capacitor 205 is described in further detail with reference to FIG. 3.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 using plate line 210 and controlling the voltage of cell bottom 215 using digit line 115-a. To write a logic "0," cell plate 230 may be taken high, that is, a positive voltage may be applied to plate line 210, and cell bottom 215 may be taken low—e.g., virtually grounded using digit line 115-a. The opposite process is performed to write a logic "1", i.e., cell plate 230 may be taken low and cell bottom 215 may be taken high. Read and write operations of capacitor 205 may account for the non-linear properties associated with a ferroelectric device.

Figure 3:
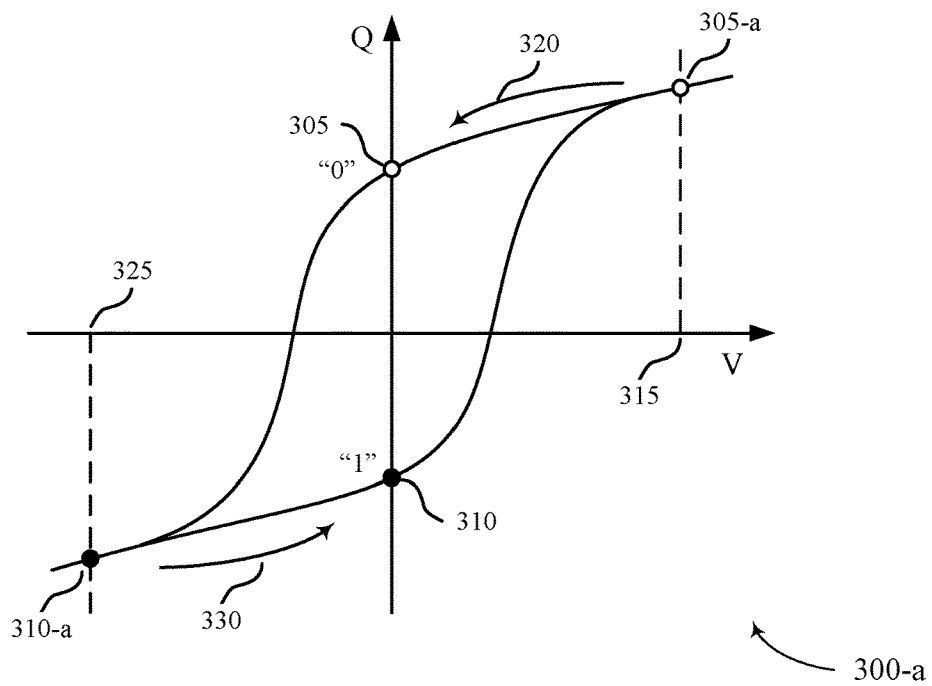
FIG. 3 illustrates example hysteresis plots for operating a ferroelectric memory cell that supports a ground reference scheme in accordance with various embodiments of the present disclosure.
Figure 3:
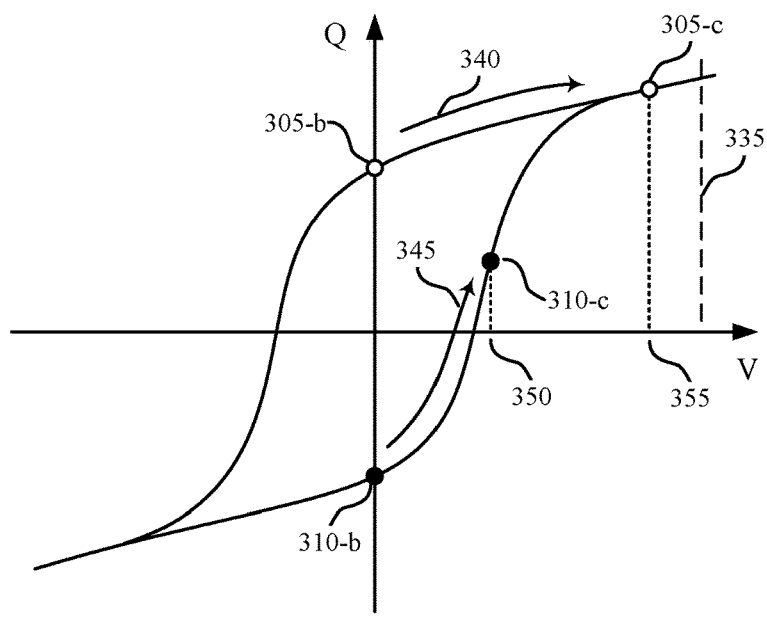

FIG. 3 illustrates examples of such non-linear properties with hysteresis curves 300-a and 300-b for a memory cell that supports a ground reference scheme in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic "0" and charge state 310 represents a logic "1." In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Net voltage 335 may be applied to the cell plate (e.g., cell plate 230 with reference to FIG. 2) of the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance, and the voltage measured at a sense component may depend on the resulting voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the difference of the voltage applied to the cell plate (e.g., voltage 335) and the voltage across the capacitor (e.g., voltage 350 or voltage 355) to a reference voltage, the initial state of the capacitor may be determined. As can be understood by reference to FIG. 2, the voltage of the digit line may be represented as the difference of the voltage applied to plate line 210 and the resulting voltage across the capacitor 205. As discussed above, the voltage of the digit line is based at least in part on the change in charge stored at the capacitor, and the change in charge is associated with the magnitude of the voltage that is applied across the capacitor. In some examples, the reference voltage may be an average of the digit line voltages that result from voltage 350 and 355 and, upon comparison, the sensed digit line voltage may be determined to be higher or lower than the reference voltage. A value of the ferroelectric cell (i.e., a logic "0" or "1") may then be determined based on the comparison.

However, as discussed above, the digit line and reference voltages may vary based at least in part on cell characteristics (e.g., age), environmental factors (e.g., temperature), applied plate voltage, etc. In certain scenarios, using the average of the digit line voltages as the reference voltage may decrease the sensing margin. For instance, variations in the digit line voltages resulting from two logical states may increase the average of the digit line voltages and the reference voltage may be biased towards one of the digit line voltages. Using a ground reference in place of a non-zero voltage reference (e.g., the average of the digit line voltages) may reduce errors associated with the reference voltage, simplify the generation of the reference voltage, and reduce complexity associated with sensing operations.

As discussed above, reading a memory cell that does not use a ferroelectric capacitor may degrade or destroy the stored logic state. A ferroelectric memory cell, however, may maintain the initial logic state after a read operation. For example, if charge state 305-b is stored and the read operation performed, the charge state may follow path 340 to charge state 305-c, and after removing voltage 335, the charge state may return to initial charge state 305-b, for example, by following path 340 in the opposite direction.

Figure 4:
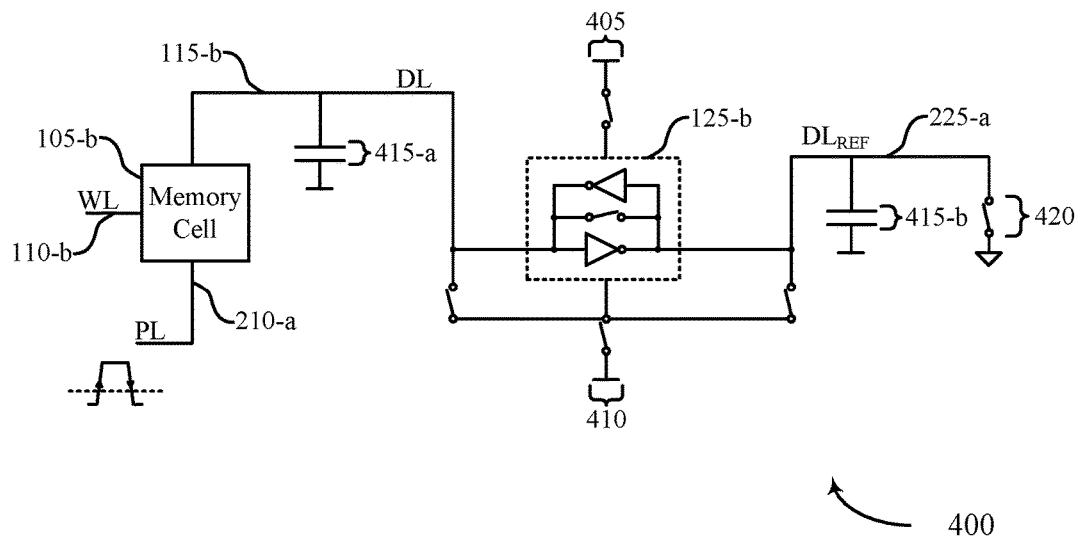
FIG. 4 illustrates an example circuit that supports a ground reference scheme for a memory cell in accordance with various embodiments of the present disclosure.

FIG. 4 illustrates an example circuit 400 that supports a ground reference scheme for a memory cell in accordance with various embodiments of the present disclosure. Circuit 400 includes memory cell 105-b, word line 110-b (which may also be referred to as access line 110-b), digit line 115-b, and sense component 125-b, which may be examples of a memory cell 105, word line 110, digit line 115, and sense component 125, respectively, described with reference to FIGS. 1 and 2. Circuit 400 also includes plate line 210-a and reference line 225-a, which may be examples of plate line 210 and reference line 225, respectively, described with reference to FIG. 2. Circuit 400 also includes voltage source 405, voltage source 410, and switching component 420.

Digit line 115-b and reference line 225-a may have respective intrinsic capacitances 415-a and 415-b, respectively. Intrinsic capacitances 415-a and 415-b may not be electrical devices—i.e., may not be two-terminal capacitors. Instead, intrinsic capacitances 415-a and 415-b may depend on physical characteristics, including the dimensions, of digit line 115-b and reference line 225-a. In some cases, reference line 225-a is an unused or inactive digit line. In some examples, although not depicted, digit line 115-b is connected to a virtual ground via a switching component. A virtual ground may act as a common reference for circuit 400 and may also be referred to as ground or 0V, although, the virtual ground may float to a voltage that is different than (e.g., greater or less than) zero volts when compared with an earth ground.

The voltage of reference line 225-a may be used by sense component 125-b as a reference for comparison against the voltage of digit line 115-b. In some examples, reference line 225-a is connected to a virtual ground to provide a ground reference for comparing with the voltage of digit line 115-b. The reference line 225-a may be separated from virtual ground through a switching component 420, which may be implemented as a transistor (e.g., a p-type field effect transistor (FET)). In other cases, reference line 225-a may be directly connected to the virtual ground.

As depicted, memory cell 105-b is in electronic communication with digit line 115-b. Memory cell 105-b may be selected using a selection component that is in electronic communication with a ferroelectric capacitor via word line 110-b, as described with reference to FIG. 2. Activating the selection component may connect the ferroelectric capacitor to digit line 115-b.

The plate line 210-a may be in electronic communication with the ferroelectric capacitor (e.g., a plate of the ferroelectric capacitor). To read memory cell 105-b, a voltage may be applied to plate line 210-a of the ferroelectric capacitor of memory cell 105-b. Applying a positive voltage to plate line 210-a in combination with applying a voltage to word line 110-b may result in the ferroelectric capacitor charging digit line 115-b. After applying the positive voltage, a negative voltage may be applied to the plate line 210-a to adjust the voltage of digit line 115-b. In some cases, the negative voltage is applied after determining that the voltage of digit line 115-b has reached a threshold in response to the applied positive voltage. The negative voltage may be selected to adjust a voltage resulting from a logic state "0" stored in the ferroelectric capacitor and the voltage resulting from a stored logic state "1" to be centered around virtual ground. By way of example, ferroelectric memory cells from a ferroelectric memory array may be tested—e.g., by applying varying plate voltages, temperatures, etc.—to determine an average logic "1" voltage and an average logic "0" voltage and the negative voltage may be selected accordingly. In other cases, the negative voltage may be selected based on a mathematical model that has been developed for a ferroelectric memory array or based on established test results. In some cases, a voltage may be applied to plate line 210-a and word line 110-a via an external voltage source, amplifier, a line driver, or the like.

Sense component 125-b may be used to determine the stored state of memory cell 105-b. In some cases, sense component 125-b may be or may include a sense amplifier. Sense component 125-b may be operated by voltage source 405 and voltage source 410. In some examples, voltage source 405 is a positive supply voltage, while voltage source 410 is a negative supply voltage or a virtual ground. Sense component 125-b may be used to determine a logic value of the ferroelectric memory cell 105-b based at least in part on the voltage of digit line 115-b and the voltage of the reference line 225-a. Sense component 125-b may be activated or deactivated by a controller. In some cases, sense component 125-b is activated or "fired" to trigger a comparison between the voltage of digit line 115-b and the voltage of reference line 225-a. Sense component 125-b may latch the output of a sense amplifier to the voltage provided by either voltage source 405 or voltage source 410. For instance, if the voltage of the digit line 115-b is greater than the voltage of the reference line 225-a, then sense component 125-b may latch the output of the sense amplifier at a positive voltage supplied from voltage source 405.

Figure 5:
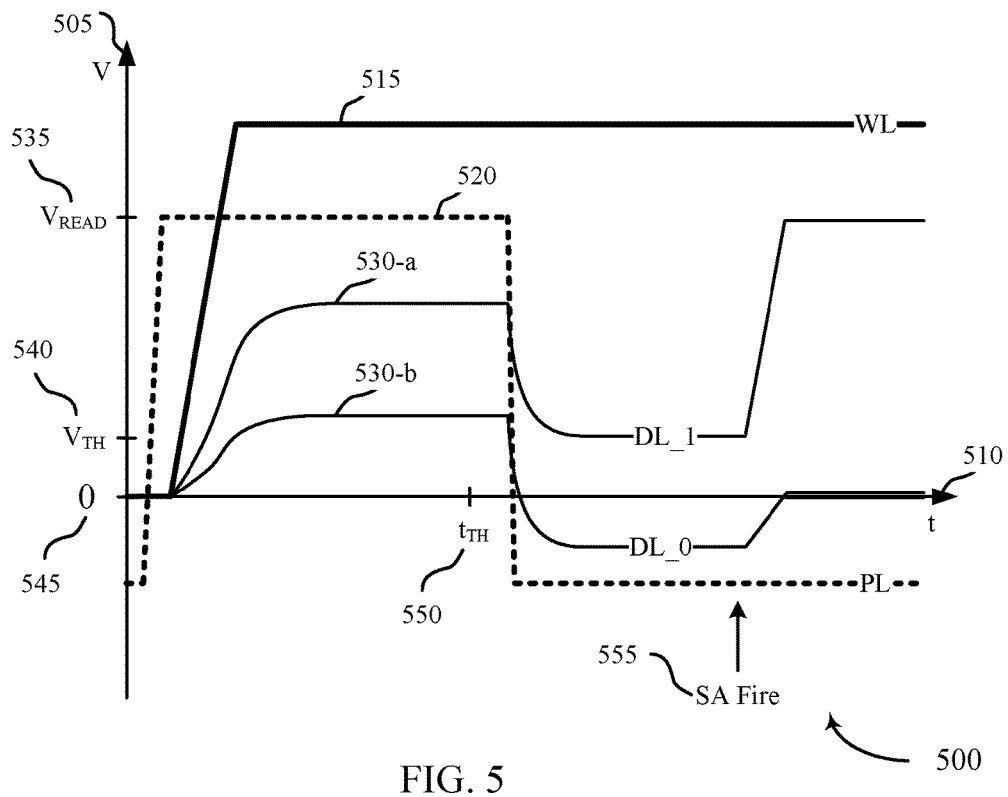
FIG. 5 illustrates a timing diagram for a ground reference scheme for a memory cell operated in accordance with various embodiments of the present disclosure.

FIG. 5 illustrates a timing diagram 500 for a ground reference scheme for a memory cell in accordance with various embodiments of the present disclosure. Timing diagram 500 depicts voltage on axis 505 and time on axis 510. The voltage of various components as a function of time may thus be represented on timing diagram 500. For example, timing diagram 500 includes word line voltage 515, plate voltage 520, and digit line voltages 530-a and 530-b. Timing diagram 500 also includes a read voltage 535, a voltage threshold 540, a reference voltage 545, and a timing threshold 550. Timing diagram 500 depicts an example operation of circuit 400 described with reference to FIG. 4. FIG. 5 is described below with reference to components of preceding figures. Voltages that approach zero may be offset from axis 510 for ease of representation; in some cases, these voltages may be equal to or substantially equal to zero.

As discussed in FIG. 4, a voltage may be applied to the plate line 210-a. In some examples, a read voltage—i.e., the voltage used to read the state of a ferroelectric capacitor, may be applied to plate line 210-a, biasing the ferroelectric capacitor. The plate voltage 520, which may be measured at the plate of the ferroelectric capacitor, may rise with the applied read voltage. After applying the read voltage, memory cell 105-b may be accessed by applying another voltage to word line 110-b. The word line voltage 515, which may be measured at the gate of a selection component of memory cell 105-a, may rise with the voltage applied to word line 110-b. As the word line voltage 515 rises, the selection component may provide a conductive path between the biased ferroelectric capacitor of memory cell 105-b and digit line 115-b. Accordingly, the digit line voltage 530 may rise as the ferroelectric capacitor discharges onto digit line 115-b. The digit line voltage 530 may be virtually grounded before a read operation is performed. In one example, a switching component, such as a transistor, may be used to connect the digit line 115-c to ground.

Upon selecting the word line 110-b, the ferroelectric capacitor of memory cell 105-b shares charge with the intrinsic capacitance 415-a until the voltage of the cell bottom (e.g., cell bottom 215 as described with reference to FIG. 2) of the ferroelectric capacitor of memory cell 105-*b* and the voltage across intrinsic capacitance 415-*a* are equal. The digit line voltage 530 may rise to one of two voltages based on the stored state. Although, as discussed above, these two voltages may vary with characteristics of the memory cell 105-*b*, temperature, etc. If a logic "1" is stored by the ferroelectric capacitor, then digit line voltage 530-*a* may result, while digit line voltage 530-*b* may result if a logic "0" is stored. Digit line voltage 530-*a* may be associated with a smaller voltage drop over the ferroelectric cell and therefore a higher digit line voltage when compared with digit line voltage 530-*b*, as described with reference to FIG. 3.

According to the example depicted in FIG. 5, after the digit line voltage 530 reaches a voltage threshold or a timing threshold 550, or both, a negative voltage is applied to plate line 210-*a*, driving plate voltage 520 negative. In some cases, the negative voltage may be applied after determining that the positive voltage has been applied for a predetermined duration—e.g., for a duration that exceeds timing threshold 550. The predetermined duration may be determined based at least in part on a characteristic of the ferroelectric capacitor, a characteristic of the digit line, a timing associated with reading or writing to the ferroelectric memory cell, or any combination thereof. In other cases, the negative voltage may be applied based on determining that the digit line has reached a threshold value. Or in some cases, the negative voltage is applied based on determining that the digit line voltage 530 has settled—e.g., that the rate of change of the voltage of the digit line has reached a threshold. For instance, it may be determined that the rate of change is lower than a threshold value (e.g., less than 10 mV/ns). In other examples, the negative voltage may be applied based on determining that the digit line voltage 530 is within a percent range (e.g., within 5%) of an expected settling voltage of either the digit line voltage 530-*a* or 530-*b*. In some cases, the expected settling voltage may be determined using experimental data, a prediction model, or the like.

As plate voltage 520 transitions to a negative voltage, the digit line voltage 530 may return charge to the ferroelectric capacitor and the digit line voltage 530 may also decrease. The decrease in the digit line voltage 530 may be dependent upon the magnitude of the applied negative. In some cases, the magnitude of the negative voltage is selected based at least in part on the resulting decrease in digit line voltages 530-*a* and 530-*b*. In some examples, the negative voltage is selected to center the digit line voltages 530-*a* and 530-*b*—i.e., the possible digit line voltages resulting from selecting the memory cell—around a reference voltage 545, which may be at a virtual ground (e.g., 0V as shown in timing diagram 500). In some cases, reference voltage 545 may be generated by connecting reference line 225-*a* to virtual ground via switching component 420. After the digit line voltages 530 resulting from the applied negative voltage have settled, sense component 125-*b* is fired at time 555.

The sense component 125-*b* may compare the digit line voltage 530 with the reference voltage 545 and the output of the sense component 125-*b* may be latched, accordingly. For instance, if a logic value "1" is stored by the ferroelectric capacitor, then the sense component 125-*b* may compare digit line voltage 530-*a* with reference voltage 545 and may determine the digit line voltage 530-*a* is higher than the reference voltage 545. Therefore, the output of the sense component 125-*b* may be driven to a positive supply voltage and latched. In this example, when the sense component 125-*b* outputs the positive supply voltage, digit line 115-*b* is also driven to the supply voltage.

Figure 6:
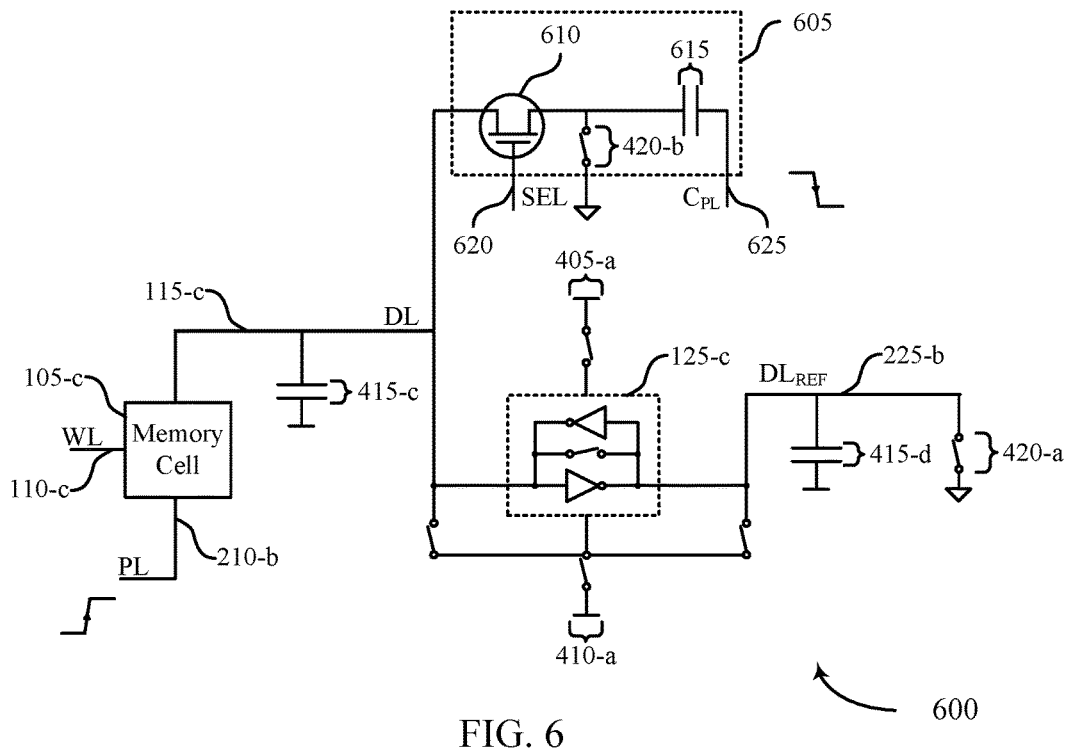
FIG. 6 illustrates an example circuit that supports a ground reference scheme for a memory cell in accordance with various embodiments of the present disclosure.

FIG. 6 illustrates an example circuit 600 that supports a ground reference scheme for a memory cell in accordance with various embodiments of the present disclosure. Circuit 600 includes memory cell 105-*c*, word line 110-*c* (which may also referred to as access line 110-*c*), digit line 115-*c*, and sense component 125-*c*, which may be examples of memory cell 105, word line 110, digit line 115, and sense component 125, respectively, described with reference to FIGS. 1, 2, 4, and 5. Circuit 600 may also include plate line 210-*b*, and reference line 225-*b*, which may be examples of plate line 210 and reference line 225, respectively, described with reference to FIGS. 2 and 4. Additionally, circuit 600 includes voltage source 405-*a*, voltage source 410-*a*, intrinsic capacitances 415-*c* and 415-*d*, and switching components 420-*a* and 420-*b*, which may be examples of voltage source 405, voltage source 410, and intrinsic capacitances 415, and switching component 420 described with reference to FIG. 4. Circuit 600 may also include reference circuit 605, which may be in electronic communication with digit line 115-*c*, and which may include reference capacitor 615, selection component 610, selection line 620, and reference plate line 625.

Selection component 610 may be used to connect digit line 115-*c* and reference capacitor 615. Reference capacitor 615 may be implemented as a dielectric, ceramic, electrolytic, or a ferroelectric capacitor. In some cases, selection component 610 may be a transistor, such as a p-type FET. Selection line 620 may be in electronic communication with and used to activate selection component 610. For example, reference capacitor 615 may be accessed by applying a voltage to selection line 620, which, in the case of a ferroelectric capacitor, may be implemented as a word line. The size of reference capacitor 615 may be selected so that the voltages of digit line 115-*c* that result from a logic "0" and a logic "1" are centered around a ground reference. In one example, the size of the capacitor is chosen to be approximately 80 femtofarads (fF). In some cases, the size of the reference capacitor 615 may be selected to be the average of the capacitance associated with a ferroelectric capacitor storing a logic "0" and the capacitance associated with a ferroelectric capacitor storing a logic "1". In another example, if a ferroelectric capacitor is used, the size of the ferroelectric capacitor may be chosen to be greater than the size of the ferroelectric capacitor of memory cell 105-*c*. In some examples, the reference capacitor may be implemented by using a first ferroelectric capacitor storing a logic "0" and a second ferroelectric capacitor storing a logic "0."

Reference plate line 625 may be in electronic communication with reference capacitor 615 and digit line 115-*c*. Initially, a positive voltage may be applied to reference plate line 625 and a zero voltage may be applied to plate line 210-*b* to bias a ferroelectric capacitor of memory cell 105-*c* and to bias reference capacitor 615. In some cases, the other side of reference capacitor 615 may be maintained at a ground reference via switching component 420-*b* to enable charging of reference capacitor 615. Subsequently, selection voltages may be applied to word line 110-*c* and selection line 620 to access memory cell 105-*c* and reference circuit 605. Applying the selection voltages to word line 110-*c* and selection line 620 may connect the ferroelectric capacitor of memory cell 105-*c* and reference capacitor 615 to digit line 115-*c*, respectively. In some cases, digit line 115-*c* may maintain a connection to virtual ground for a duration after the selection voltages have been applied, and may subsequently be isolated from ground. At a later point in time, a zero voltage may be applied to reference plate line 625 and a positive voltage may be applied to plate line 210-b. In some cases, the magnitude of the positive voltage applied to the plate line 210-b may be different than the magnitude of the positive voltage previously applied to the reference capacitor 615.

Applying the inverse, or complementary, voltages (i.e., the zero voltage to reference plate line 625 and the positive voltage to plate line 210-b) may cause the ferroelectric capacitor to discharge onto digit line 115-c while reference capacitor 615 draws charge from digit line 115-c. As charge builds up on digit line 115-c, the voltage of digit line 115-c may increase; and as charge is drawn from digit line 115-c, the voltage of digit line 115-c may decrease. These complementary functions may be used to center the resulting logic "1" and logic "0" voltages—i.e., the possible voltages of digit line 115-c that result from selecting memory cell 105-c—around zero volts. The voltage of digit line 115-c may be compared with the voltage of reference line 225-b to determine the logic value that is stored by memory cell 105-c. In some cases, the voltage of reference line 225-b may be at virtual ground, as discussed above. In some cases, a voltage may be applied to plate line 210-b, word line 110-b, selection line 620, and reference plate line 625, via an external voltage source, an amplifier, a line driver, or the like.

Figure 7:
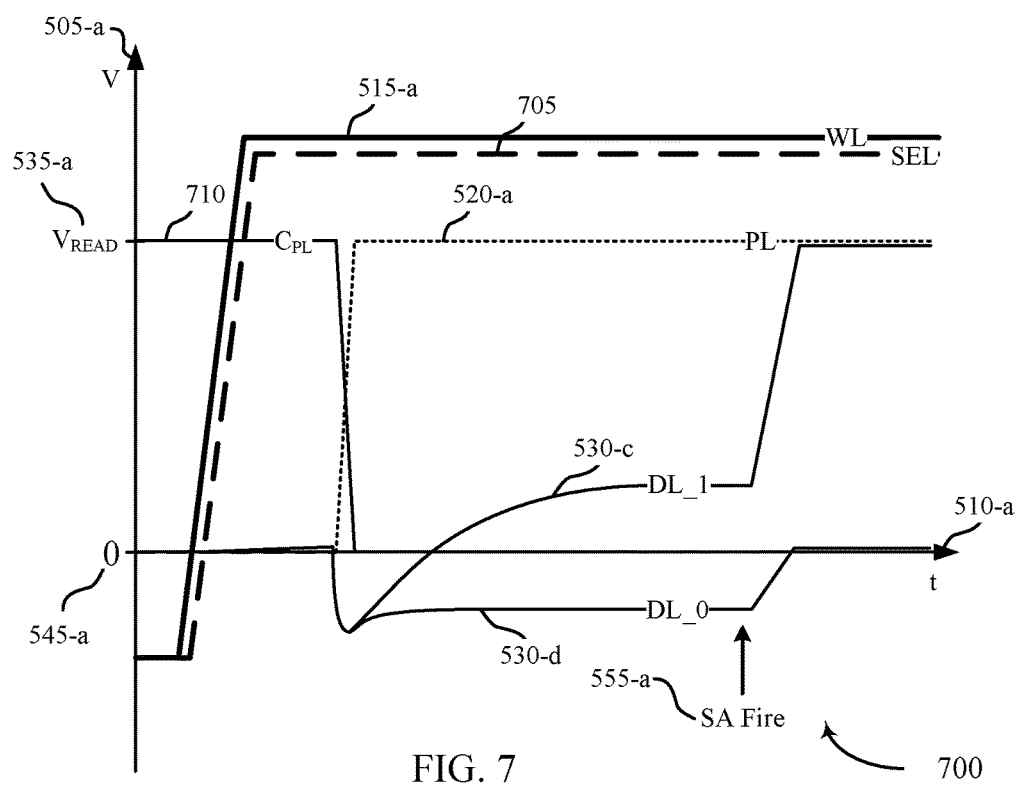
FIG. 7 illustrates a timing diagram for a ground reference scheme for a memory cell operated in accordance with various embodiments of the present disclosure.

FIG. 7 illustrates a timing diagram 700 that supports a ground reference scheme for a memory cell in accordance with various embodiments of the present disclosure. Timing diagram 700 depicts voltage on axis 505-a and time on axis 510-a. The voltage of various components as a function of time are represented on timing diagram 700. For example, timing diagram 700 includes word line voltage 515-a, plate voltage 520-a, and digit line voltages 530-c and 530-d, which may be examples of word line voltage 515, plate voltage 520, and digit line voltage 530 described with reference to FIG. 5. Timing diagram 700 may also include a read voltage 535-a and a reference voltage 545-a, which may be examples of read voltage 535 and reference voltage 545 described with reference to FIG. 5. Timing diagram 700 may result from operating circuit 600 described with reference to FIG. 6. FIG. 7 is described below with reference to components of preceding figures. Voltages that approach zero may be offset from axis 510-a for ease of representation, in some cases, these voltages may be equal to or substantially equal to zero.

As discussed with reference to FIG. 6, a reference plate voltage 710 may be applied to the reference plate line 625 to charge reference capacitor 615, while the plate voltage 520-a applied to plate line 210-b and the other side of the reference capacitor may be maintained at virtual ground. In some cases, the magnitude of the applied voltage may be a voltage associated with a read operation. Subsequently, selection voltage 705 may be applied to selection line 620 to create a conductive path between reference capacitor 615 and digit line 115-c via selection component 610. Substantially simultaneously with applying selection voltage 705, word line voltage 515-a may be applied to word line 110-c to create a conductive path between a ferroelectric capacitor of memory cell 105-c and digit line 115-c. In some cases, the same voltage is used to access the ferroelectric capacitor and reference capacitor of both memory cell 105-c and reference circuit 605, while in other cases different voltages are used. In some cases, the digit line voltage 530 may be maintained at a ground reference via switching component 415-c before and after selection voltage 705 and word line voltage 515-a has been applied.

The reference plate voltage 710 and plate voltage 520-a may then be inversely applied—e.g., the voltages may be moved in complementary directions—to the reference plate line 625 and the plate line 210-b. Accordingly, the reference plate voltage 710 may decrease and the plate voltage 520-a may increase. That is, the voltage applied to reference plate line 625 may be removed to be zero volts, and, substantially simultaneously, a voltage (e.g., a read voltage) may be applied to plate line 210-b. Applying the voltages substantially simultaneously means applying the voltages at or about the same time. Applying voltages substantially simultaneously may also mean that within a certain time period of applying one voltage, a second voltage is applied—e.g., within half a nanosecond (ns) of applying a first voltage, the second voltage is applied. For instance, the decrease of reference plate voltage 710 may overlap with the increase of plate voltage 520-a. In some cases, the time period between the voltages applied at word line 110-c and reference plate line 625 increases due to characteristics of a memory array (e.g., propagation delay). In these cases, the increase and decrease of reference plate voltage 710 and plate voltage 520-a may be non-overlapping and the time period between applying the voltages may be as large as 3 ns. As depicted, increasing the plate voltage 520-a may cause the ferroelectric capacitor of memory cell 105-c to discharge onto digit line 115-c, while decreasing the reference plate voltage 710 may pull charge from digit line 115-c.

Providing charge to digit line 115-c may raise the digit line voltage 530 and removing charge may lower the digit line voltage 530. The amount of charge removed from digit line 115-c may be associated with the rate of change in reference plate voltage 710, the size of reference capacitor 615, the charge currently stored by capacitor 615, the magnitude of the reference plate voltage 710, or any combination thereof. In some cases, the reference plate voltage 710 and reference capacitor 615 size are selected to center the resulting digit line voltages 530-c and 530-d around a virtual ground. The sense component 125-c may be fired at time 555-a to compare the digit line voltage 530 with the reference voltage 545-a. If the sensed digit line voltage 530 is high (e.g., digit line voltage 530-c) and compared with reference 545-a, then the output of sense component 125-c and the digit line voltage 530-c may rise to the voltage supplied by voltage source 405-a. Otherwise, if the sensed digit line voltage 530 is low (e.g., digit line voltage 530-d) and compared with the reference, then the output of the sense component 125-c and the digit line voltage may rise to the voltage supplied by voltage source 410-a. The output of the sense component 125-c may be latched and used to determine the stored state associated with memory cell 105-c.

Figure 8:
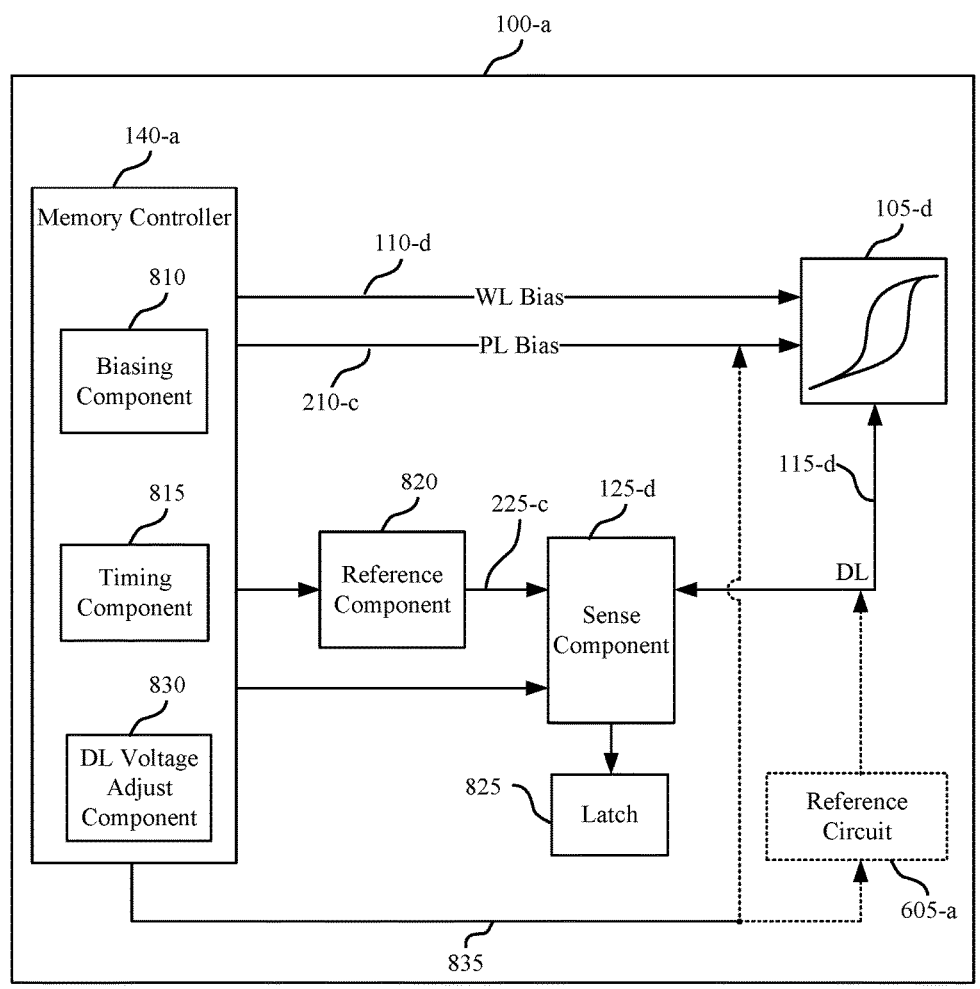
FIG. 8 illustrates an example ferroelectric memory array that supports a ground reference scheme in accordance with various embodiments of the present disclosure.

FIG. 8 shows a block diagram 800 of a memory array 100-a that supports a ground reference scheme for a memory cell in accordance with various embodiments of the present disclosure. Memory array 100-a may contain memory controller 140-a and memory cell 105-d, which may be examples of memory controller 140 and memory cell 105 described with reference to FIGS. 1 and 2. Memory controller 140-a may include biasing component 810, timing component 815, and digit line (DL) voltage adjust component 830, and may operate memory array 100-a as described in FIGS. 1-7.

Memory controller 140-a may be in electronic communication with word line 110-d (which may also referred to as access line 110-d), digit line 115-d, sense component 125-d, plate line 210-c, and reference circuit 605-a, and memory cell 105-d which may be examples of word line 110, digit line 115, sense component 125, plate line 210, reference circuit 605, and memory cell as described with reference to FIG. 1, 2, 4, or 6. Memory array 100-*a* may also include reference component 820, latch 825, and control line 835. The components of memory array 100-*a* may be in electronic communication with each other and may perform the functions described with reference to FIGS. 1-7. In some cases, reference component 820, sense component 125-*a*, and latch 825 may be components of memory controller 140-*a*.

Memory controller 140-*a* may be configured to activate word line 110-*d*, plate line 210-*a*, or digit line 115-*d* by applying voltages to those various nodes. In some cases, memory controller 140-*a* may perform its operations using biasing component 810. For example, biasing component 810 may be configured to apply a voltage to operate memory cell 105-*d* to read or write memory cell 105-*d* as described above. In some cases, memory controller 140-*a* may include a row decoder, column decoder, or both, as described with reference to FIG. 1. This may enable memory controller 140-*a* to access one or more memory cells 105. Biasing component 810 may also provide voltages to reference component 820 in order to generate a reference signal for sense component 125-*a*. Additionally, biasing component 810 may provide voltages for the operation of sense component 125-*a*.

In some cases, memory controller 140-*a* may perform its operations using timing component 815. For example, timing component 815 may control the timing of the various word line selections or plate biasing, including timing for switching and voltage application to perform the memory functions, such as reading and writing, discussed herein. In some cases, timing component 815 may control the operations of biasing component 810. In some cases, timing component 815 may be used to select memory cell 105-*d* for a read operation and to trigger reference circuit 605-*a*.

Reference component 820 may include various components to generate a reference signal for sense component 125-*a*. Reference component 820 may include circuitry specifically configured to produce a reference signal. In some cases, reference component 820 may be other ferroelectric memory cells 105. In some examples, reference component 820 may be configured to output a voltage with a value between the two sense voltages, as described with reference to FIG. 3. Or reference component 820 may be designed to output a virtual ground. Sense component 125-*a* may compare a signal from memory cell 105-*d* (through digit line 115-*d*) with a reference signal from reference component 820. Upon determining the logic state, the sense component may then store the output in latch 825, where it may be used in accordance with the operations of an electronic device using the memory device of which memory array 100-*a* is a part.

In some cases, memory controller 140-*a* may adjust the voltage of digit line 115-*d* via control line 835. For example, DL voltage adjust component 830 may be used to adjust the voltage of digit line 115-*d* so that a ground reference may be utilized. In some cases, DL voltage adjust component 830 may be used to center the digit line voltages resulting from an initial logic state "1" or "0." For instance, DL voltage adjust component 830, in conjunction with biasing component 810 and timing component 815, may be used to apply a positive voltage to plate line 210-*c*, determine that a voltage of digit line 115-*d* has reached a threshold, and apply a negative voltage to plate line 210-*c* after the voltage of digit line 115-*d* has reached a threshold. In certain examples, memory controller 140-*a* may bias plate line 210-*c* using control line 835.

For example, biasing component 810 may connect the ferroelectric capacitor of memory cell 105-*d* to a first voltage source (e.g., a positive voltage source) or to a second voltage source (e.g., a negative voltage source), or both. The timing component 815 and/or DL voltage adjust component 830 may be used to determine that a voltage of digit line 115-*d* has reached a threshold in response to an applied positive voltage. In some cases, determining the voltage of the digit line 115-*d* has reached a threshold may be based at least in part on determining that the positive voltage has been applied for a predetermined duration, determining that the voltage of the digit line has reached a threshold voltage, determining that a rate of change of the voltage of the digit line has reached the threshold, or any combination thereof. Memory controller 140-*a* may be used to trigger sense component 125-*a* to compare the voltage of the digit line 115-*d* to a ground reference after the negative voltage is applied. In some cases, memory controller 140-*a* may use an output of sense component 125-*a* is used to determine a logic value of the ferroelectric memory cell based at least in part on the comparison of the voltage of the digit line to the ground reference.

In another example, DL voltage adjust component 830 may be used in combination with biasing component 810, timing component 815, and reference circuit 605-*a* to apply a first voltage to plate line 210-*c* and a second voltage to reference circuit 605-*a*, wherein the second voltage is an inverse of the first voltage. In certain examples, memory controller 140-*a* utilizes biasing component 810 and control line 835 trigger reference circuit 605-*a* and to bias plate line 210-*c*.

For example, biasing component 810 may be used to connect a first voltage source to a ferroelectric capacitor of the ferroelectric memory cell 105-*d*, wherein the ferroelectric capacitor is in electronic communication with digit line 115-*d* via a first selection component. Biasing component 810 may also be used to connect a second voltage source to a reference capacitor of reference circuit 605-*a*, wherein the reference capacitor is in electronic communication with the digit line via a second selection component, wherein the second voltage is an inverse of the first voltage and is applied based at least in part on applying the first voltage. In some cases, timing component 815 may trigger the biasing component 810 to apply the first voltage and second voltages substantially simultaneously. Biasing component 810 may also be used to activate the first selection component to perform a read operation of the ferroelectric memory cell and to activate the second selection component to transfer a charge of the reference capacitor to digit line 115-*d* during the read operation. Biasing component 810 may also be used to virtually ground the digit line before connecting the first voltage source to the ferroelectric capacitor or the second voltage source to the reference capacitor. As above, sense component 125-*a* may compare a signal from memory cell 105-*d* (through digit line 115-*d*) with a reference signal from reference component 820. In some cases, memory controller 140-*a* may use an output of sense component 125-*a* is used to determine a logic value of the ferroelectric memory cell based at least in part on the comparison of the voltage of the digit line to the ground reference.

Figure 9:
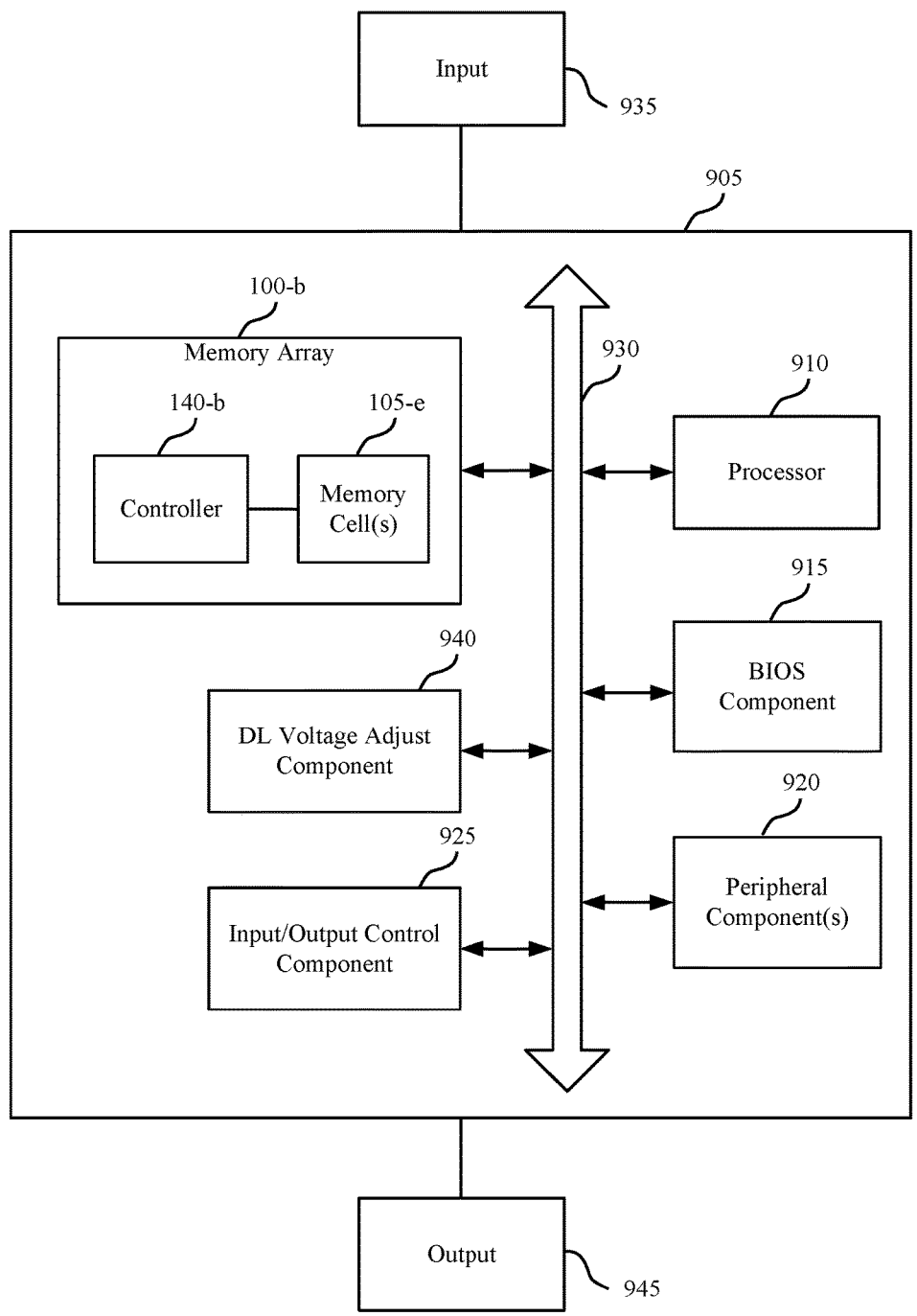
FIG. 9 illustrates a device, including a memory array, that supports a ground reference scheme in accordance with various embodiments of the present disclosure.

FIG. 9 illustrates a system 900 that supports a ground reference scheme for a memory cell in accordance with various embodiments of the present disclosure. System 900 includes a device 905, which may be or include a printed circuit board to connect or physically support various components. Device 905 includes a memory array 100-b, which may be an example of memory array 100 described with reference to FIG. 1 and FIG. 6. Memory array 100-b may contain memory controller 140-b and memory cells 105-e, which may be examples of memory controller 140 described with reference to FIGS. 1 and 6 and memory cells 105 described with reference to FIGS. 1, 2, 4, 6, and 8. Device 905 may also include a processor 910, BIOS component 915, peripheral component(s) 920, input/output control component 925, and DL voltage adjust component 940. DL voltage adjust component 940 may be an example of DL voltage adjust component 830 as described with reference to FIG. 8. The components of device 905 may be in electronic communication with one another through bus 930.

Processor 910 may be configured to operate through memory controller 140-b. In some cases, processor 910 may perform the functions of memory controller 140 described with reference to FIGS. 1 and 6. In other cases, memory controller 140-b may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein, including supporting a ground reference scheme for a memory cell. Processor 910 may, for example, be configured to execute computer-readable instructions stored in to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output control component 925, etc. BIOS component 915 may include a program or software stored in read-only memory (ROM), flash memory, or any other non-volatile memory.

Peripheral component(s) 920 may be any input or output device, or an interface for such devices, that is integrated into device 905. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 925 may manage data communication between processor 910 and peripheral component(s) 920, input devices or output devices received via input 935 or output 945. Input/output control component 925 may also manage peripherals not integrated into device 905. In some cases, input/output control component 925 may represent a physical connection or port to the external peripheral.

Input 935 may represent a device or signal external to device 905 that provides input to device 905 or its components. This may include a user interface or interface with or between other devices. In some cases, input 935 may be a peripheral that interfaces with device 905 via peripheral component(s) 920 or may be managed by input/output control component 925.

Output 945 may be implemented as a device or signal external to device 905 configured to receive output from device 905 or any of its components. Examples of an output device may include a display, audio speakers, a printing device, another processor or printed circuit board, etc. In some cases, output 945 may be a peripheral that interfaces with device 905 via peripheral component(s) 920 or may be managed by input/output control component 925.

The components of memory controller 140-b, device 905, and memory array 100-b may be made up of circuitry designed to carry out their functions. This may include various circuit elements, for example, conductive lines, transistors, capacitors, inductors, resistors, amplifiers, or other active or passive elements, configured to carry out the functions described herein.

Figure 10:
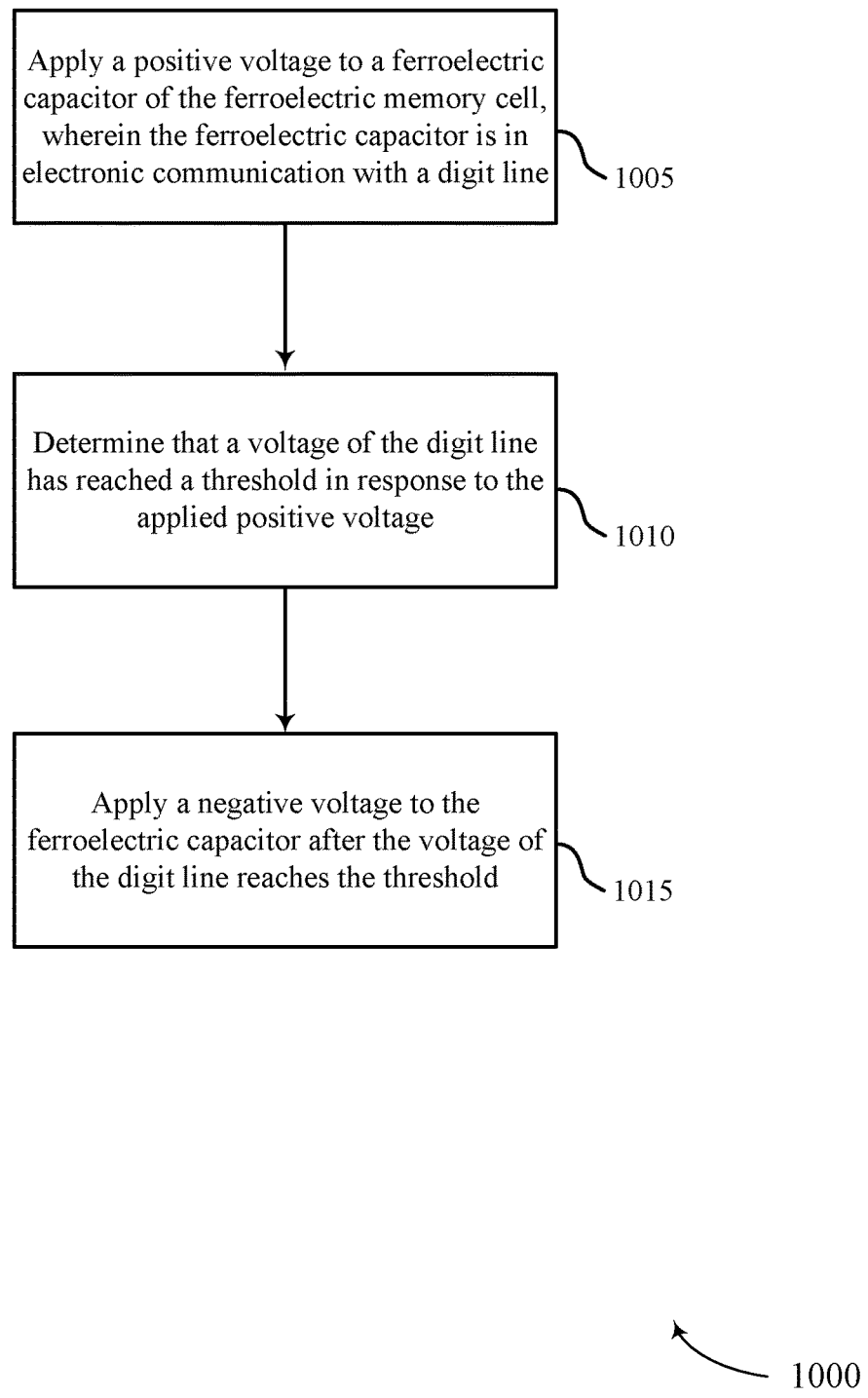
FIGS. 10-11 are flowcharts that illustrate a method or methods for a ground reference scheme for a memory cell in accordance with various embodiments of the present disclosure.

FIG. 10 shows a flowchart illustrating a method 1000 for utilizing a ground reference scheme for a memory cell in accordance with various embodiments of the present disclosure. The operations of method 1000 may be implemented by a memory array 100, as described with reference to FIGS. 1-9. For example, the operations of method 1000 may be performed by a memory controller 140, as described with reference to FIGS. 1, 8, and 9. In some examples, a memory controller 140 may execute a set of codes to control the functional elements of the memory array 100 to perform the functions described below. Additionally or alternatively, the memory controller 140 may perform features of the functions described below using special-purpose hardware.

At block 1005, the method may include applying a positive voltage to a ferroelectric capacitor of the ferroelectric memory cell, wherein the ferroelectric capacitor is in electronic communication with a digit line. In certain examples, the operations of block 1005 may be performed or facilitated by the biasing component 810, as described with reference to FIG. 8.

At block 1010, the method may include determining that a voltage of the digit line has reached a threshold in response to the positive voltage being applied. In certain examples, the operations of block 1010 may be performed or facilitated by the timing component 815, as described with reference to FIG. 8. In some cases, determining that the voltage of the digit line has reached the threshold includes determining that the voltage of the digit line has reached a threshold voltage. Additionally or alternatively, determining that the voltage of the digit line has reached the threshold may include determining that a rate of change of the voltage of the digit line has reached the threshold.

At block 1015, the method may include applying a negative voltage to the ferroelectric capacitor after the voltage of the digit line reaches the threshold. In certain examples, the operations of block 1015 may be performed or facilitated by the biasing component 810, as described with reference to FIG. 8. In some cases, a magnitude of the negative voltage applied to the ferroelectric capacitor is based at least in part on the threshold. Determining that the voltage of the digit line has reached the threshold may include determining that the positive voltage has been applied for a predetermined duration. The predetermined duration may be based at least in part on at least one of a characteristic of the ferroelectric capacitor, a characteristic of the digit line, a timing associated with reading or writing to the ferroelectric memory cell, or any combination thereof. In some cases, the method includes comparing the voltage of the digit line to a ground reference after the negative voltage is applied. In some cases, a logic value of the ferroelectric memory cell is determined based at least in part on the comparison of the voltage of the digit line to the ground reference.

Figure 11:
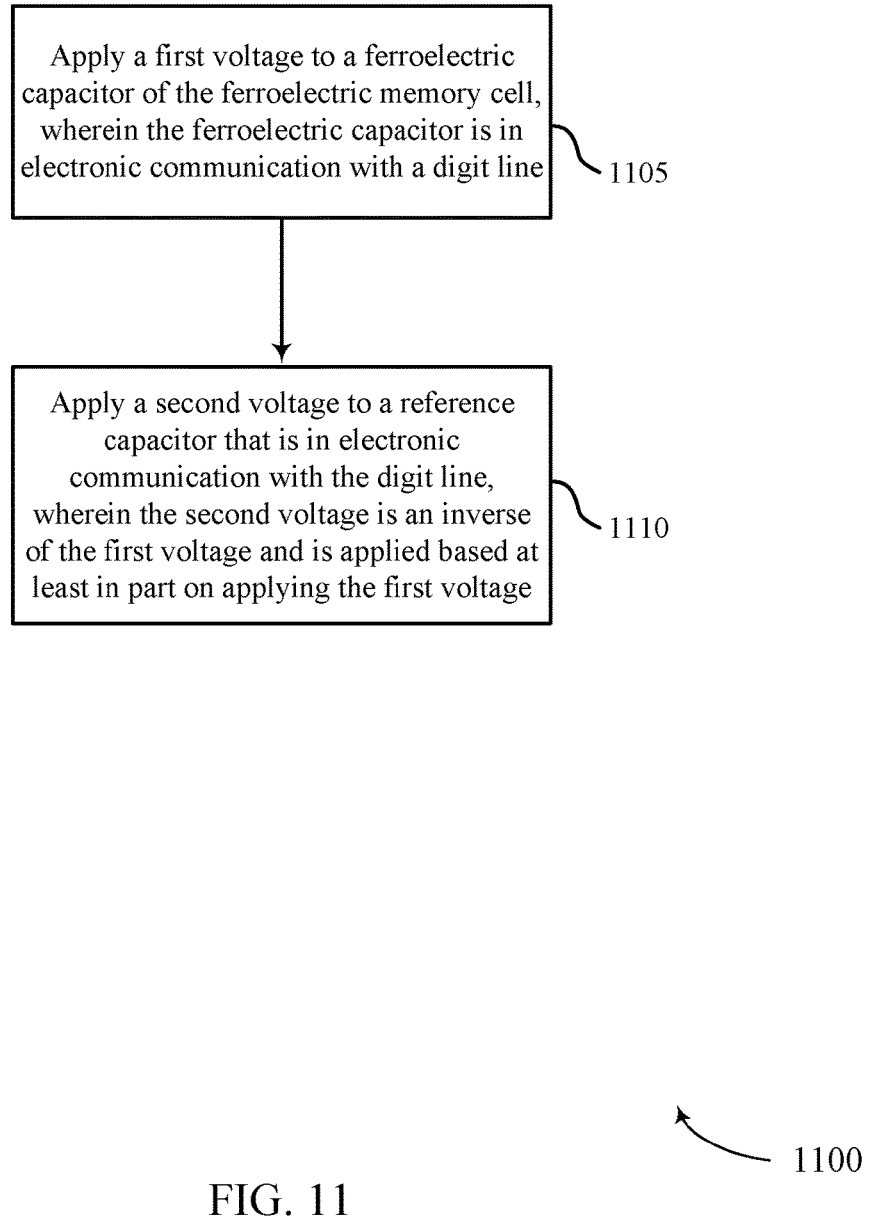

FIG. 11 shows a flowchart illustrating a method 1100 for utilizing a ground reference scheme for a memory cell in accordance with various embodiments of the present disclosure. The operations of method 1100 may be implemented by a memory array 100, as described with reference to FIGS. 1-9. For example, the operations of method 1100 may be performed by a memory controller 140, as described with reference to FIGS. 1, 8, and 9. In some examples, a memory controller 140 may execute a set of codes to control the functional elements of the memory array 100 to perform the functions described below. Additionally or alternatively, the memory controller 140 may perform features of the functions described below using special-purpose hardware.

At block 1105, the method may include applying a first voltage to a ferroelectric capacitor of the ferroelectric memory cell, wherein the ferroelectric capacitor is in electronic communication with a digit line. In certain examples, the operations of block 1105 may be performed or facilitated by the biasing component 810, as described with reference to FIG. 8. In some examples, the method may include selecting the ferroelectric memory cell for a read operation by activating a first selection component that is in electronic communication with the ferroelectric capacitor and the digit line; and activating a second selection component that is in electronic communication with the reference capacitor and the digit line. In some cases, the first selection component and the second selection component are activated prior to applying the first voltage.

At block 1110, the method may include applying a second voltage to a reference capacitor that is in electronic communication with the digit line, wherein the second voltage is an inverse of the first voltage and is applied based at least in part on applying the first voltage. In certain examples, the operations of block 1110 may be performed or facilitated by the biasing component 810, as described with reference to FIG. 8. In some examples, the first voltage and second voltages are applied substantially simultaneously. In some cases, the first selection component and the second selection component are activated prior to applying the first voltage and/or the second voltage. In some examples, the method may include virtually grounding the digit line before applying the first voltage or the second voltage. In some examples, the method includes comparing a voltage of the digit line to a ground reference after the second voltage is applied to the reference capacitor. Determining a logic value of the ferroelectric memory cell may be based at least in part on the comparison of the voltage of the digit line to the ground reference Thus, methods 1000 and 1100 may provide for utilizing a ground reference scheme. It should be noted that methods 1000 and 1100 describe possible implementations, and the operations and steps may be rearranged or otherwise modified such that other implementations are possible. In some examples, features from two or more of the methods 1000 and 1100 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, embodiment, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). The term "isolated" refers to a relationship between components in which electrons are not presently flowing between the components. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   applying a first voltage to a memory cell that is in electronic communication with a digit line; and
   applying a second voltage to a reference capacitor that is in electronic communication with the digit line, wherein the second voltage is an inverse of the first voltage, and wherein the second voltage is applied before a rate of change of a voltage of the digit line reaches a threshold in response to the first voltage being applied.

2. The method of claim 1, further comprising:
   selecting the memory cell for a read operation, wherein the selecting comprises:
   activating a first selection component that is in electronic communication with the memory cell and the digit line; and
   activating a second selection component that is in electronic communication with the reference capacitor and the digit line.

3. The method of claim 1, further comprising:
   comparing the voltage of the digit line to a ground reference after the second voltage is applied to the reference capacitor.

4. The method of claim 3, further comprising:
   determining a logic value of the memory cell based at least in part on comparing the voltage of the digit line to the ground reference.

5. The method of claim 1, wherein the first voltage and the second voltage are applied substantially simultaneously.

6. The method of claim 1, further comprising:
   virtually grounding the digit line before applying the first voltage or the second voltage.

7. The method of claim 1, wherein the rate of change of the voltage of the digit line reaches the threshold based at least in part on the voltage of the digit line reaching a settling voltage.

8. The method of claim 1, wherein:
the rate of change of the voltage of the digit line reaches the threshold based at least in part on the first voltage being applied for a duration; or
the rate of change of the voltage of the digit line reaches the threshold based at least in part on a magnitude of the voltage of the digit line reaching a threshold voltage.

9. An electronic memory apparatus, comprising:
a memory cell in electronic communication with a digit line via a first selection component;
a reference capacitor in electronic communication with the digit line via a second selection component; and
a controller in electronic communication with the first selection component, the second selection component, wherein the controller is operable to:
connect a first voltage source to the memory cell; and
connect a second voltage source to the reference capacitor, wherein an output of the second voltage source is an inverse of an output of the first voltage source, and wherein the output of the second voltage source is connected to the reference capacitor before a rate of change of a voltage of the digit line reaches a threshold in response to the first voltage source being connected to the memory cell.

10. The electronic memory apparatus of claim 9, wherein the controller is operable to:
activate the first selection component to perform a read operation of the memory cell; and
activate the second selection component to transfer a charge of the reference capacitor to the digit line during the read operation.

11. The electronic memory apparatus of claim 9, wherein the controller is operable to:
compare the voltage of the digit line to a ground reference after a voltage of the second voltage source is applied to the reference capacitor.

12. The electronic memory apparatus of claim 11, wherein the controller is operable to:
determine a logic value of the memory cell based at least in part on a comparison of the voltage of the digit line to the ground reference.

13. The electronic memory apparatus of claim 9, wherein the controller is operable to:
virtually ground the digit line before connecting the first voltage source to the memory cell or the second voltage source to the reference capacitor.

14. The electronic memory apparatus of claim 9, wherein the memory cell comprises a ferroelectric capacitor.

15. An apparatus, comprising:
an array of memory cells that includes a first memory cell of a plurality of memory cells;
a first voltage source coupled with the first memory cell, the first voltage source configured to apply a first voltage to the first memory cell;
a digit line coupled with the first memory cell;
a reference capacitor coupled with the digit line; and
a second voltage source coupled with the reference capacitor, wherein the second voltage source is configured to apply a second voltage to the reference capacitor, wherein the second voltage is an inverse of the first voltage, and wherein the second voltage source is configured to apply the second voltage before a rate of change of a voltage of the digit line reaches a threshold in response to the first voltage being applied.

16. The apparatus of claim 15, further comprising:
a first selection component of the first memory cell coupled with a capacitor of the first memory cell and the digit line; and
a second selection component coupled with the reference capacitor and the digit line, wherein the second selection component is configured to transfer a charge of the reference capacitor to the digit line during a read operation.

17. The apparatus of claim 15, further comprising:
a sense component coupled with the digit line, wherein the sense component is configured to compare the voltage of the digit line to a ground reference after the second voltage is applied to the reference capacitor.

18. The apparatus of claim 17, wherein the sense component is configured to determine a logic value of the first memory cell based at least in part on comparing the voltage of the digit line to the ground reference.

19. The apparatus of claim 15, further comprising:
a third voltage source coupled with the digit line, wherein the third voltage source is configured to apply a third voltage to the digit line before the first voltage source applies the first voltage to the first memory cell.

20. The apparatus of claim 15, wherein the first memory cell comprises a ferroelectric capacitor.

* * * * *